United States Patent
Cheng (10) Patent No.: US 11,152,377 B2
(45) Date of Patent: Oct. 19, 2021

(54) NANOSHEET SRAM BY SIT PROCESS

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/394,343

(22) Filed: Apr. 25, 2019

(65) Prior Publication Data
US 2020/0343247 A1 Oct. 29, 2020

(51) Int. Cl.
*H01L 27/11* (2006.01)
*H01L 29/423* (2006.01)
*H01L 29/786* (2006.01)
*H01L 29/06* (2006.01)
*H01L 21/308* (2006.01)

(52) U.S. Cl.
CPC ...... *H01L 27/1104* (2013.01); *H01L 27/1108* (2013.01); *H01L 29/0673* (2013.01); *H01L 29/42392* (2013.01); *H01L 29/78696* (2013.01); *H01L 21/3086* (2013.01)

(58) Field of Classification Search
CPC ....... H01L 27/11–1116; H01L 29/0673; H01L 29/42392; H01L 21/3086
See application file for complete search history.

(56) References Cited

U.S. PATENT DOCUMENTS

| | | | |
|---|---|---|---|
| 8,735,296 B2 | 5/2014 | Jung et al. | |
| 9,437,501 B1 | 9/2016 | Cheng et al. | |
| 9,660,028 B1 | 5/2017 | Cheng et al. | |
| 9,722,022 B2 | 8/2017 | Leobandung et al. | |
| 10,002,939 B1 | 6/2018 | Cheng et al. | |
| 10,069,015 B2 | 9/2018 | Cheng et al. | |
| 10,170,485 B2 | 1/2019 | Guillorn et al. | |
| 2009/0085119 A1* | 4/2009 | Ernst | H01L 29/66439 257/365 |
| 2011/0031473 A1 | 2/2011 | Chang et al. | |

(Continued)

OTHER PUBLICATIONS

Bae et al., "3nn GAA Technology Featuring Multi-Bridge-Channel FET for Low Power and High Performance Applications", 2018 IEEE International Electron Devices Meeting. Dec. 1, 2018. pp. 1-4.

(Continued)

*Primary Examiner* — Eric A. Ward
(74) *Attorney, Agent, or Firm* — Tutunjian & Bitetto, P.C.; Randall Bluestone (57) ABSTRACT

A method is presented for constructing high-density static random access memory (SRAM). The method includes forming a nanosheet SRAM by a sidewall image transfer (SIT) process and independently tuning widths of n-type field effect transistor (nFET) nanosheet structures and p-type field effect transistor (pFET) nanosheet structures of the nanosheet SRAM. The nFET nanosheet structures have a first width and the pFET nanosheet structures have a second width, the first width being greater than the second width. A distance between an nFET nanosheet structure and an adjacent pFET nanosheet structure is greater than a distance between two adjacent pFET nanosheet structures.

17 Claims, 8 Drawing Sheets

(56) References Cited

U.S. PATENT DOCUMENTS

| | | | |
|---|---|---|---|
| 2013/0134486 A1* | 5/2013 | LiCausi | H01L 21/823431 |
| | | | 257/288 |
| 2013/0196508 A1* | 8/2013 | LiCausi | H01L 27/1104 |
| | | | 438/696 |
| 2017/0162583 A1* | 6/2017 | Lee | H01L 29/42392 |
| 2017/0186842 A1* | 6/2017 | Leobandung | H01L 29/66742 |
| 2020/0091349 A1* | 3/2020 | Kang | H01L 29/0673 |
| 2020/0105762 A1* | 4/2020 | Xiao | H01L 21/324 |
| 2020/0135740 A1* | 4/2020 | Liaw | H01L 29/785 |

OTHER PUBLICATIONS

Jegadheesan et al., "Impact of Geometrical Parameters and Substrate on Analog/RF Performance of Stacked Nanosheet Field Effect Transistor", Materials Science in Semiconductor Processing. Apr. 1, 2019. vol. 93. pp. 188-195.

* cited by examiner

NANOSHEET SRAM BY SIT PROCESS

BACKGROUND

The present invention relates generally to semiconductor devices, and more specifically, to a nanosheet static random access memory (SRAM) formed by a sidewall image transfer (SIT) process.

Nanosheet (NS) is being pursued as a viable device architecture for scaling complementary metal oxide semiconductor (CMOS) beyond the 7 nm node. Sidewall image transfer (SIT) is a patterning technique for forming patterns with a pitch beyond the capability of lithography. For SRAM, it is desired to have a wider NS for an n-type field effect transistor (nFET) and a narrow NS for a p-type field effect transistor (pFET) to achieve optimal SRAM performance. However, the conventional SIT process for forming NS SRAM has a few drawbacks. The conventional SIT process results in the same NS width for all transistors and also results in the same spacing between adjacent NS stacks. Some dummy NS is then cut to enlarge the spacing (e.g., spacing between nFET and pFET) to meet ground rule requirements. Due to the quantization effect of the SIT, removing the dummy NS results in N-P spacing larger than needed, and, thus, results in reduced SRAM density. Therefore, there is a need to form NS SRAM without the above drawbacks.

SUMMARY

In accordance with an embodiment, a method is provided for constructing high-density static random access memory (SRAM). The method includes forming a nanosheet SRAM by a sidewall image transfer (SIT) process and independently tuning widths of n-type field effect transistor (nFET) nanosheet structures and p-type field effect transistor (pFET) nanosheet structures of the nanosheet SRAM.

In accordance with another embodiment, a method is provided for constructing high-density static random access memory (SRAM). The method includes constructing a nanosheet stack over a substrate, forming a mandrel over the nanosheet stack, forming a first set of spacers adjacent the mandrel, forming a second set of spacers adjacent the first set of spacers, forming a third set of spacers adjacent the second set of spacers, selectively removing the mandrel and the second set of spacers, and etching the nanosheet stack to form nanosheet structures having different widths and different spacing therebetween.

In accordance with yet another embodiment, a semiconductor structure is provided for constructing high-density static random access memory (SRAM). The semiconductor structure includes nFET nanosheet structures having a first width disposed over a substrate and pFET nanosheet structures having a second width disposed over the substrate, the first width being greater than the second width.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming nanosheet (NS) static random access memory (SRAM) by sidewall image transfer (SIT) process with the flexibility to independently tune the widths of nFET NS and pFET NS. The exemplary embodiments also provide the flexibility to obtain N-P spacing without the constraint of "quantization" effect of the conventional SIT process. Embodiments in accordance with the present invention provide methods and devices for forming nanosheet SRAMs with different spacings by a single spacer material. In other words, the exemplary embodiments pertain to simultaneously forming multiple nanosheet stacks for SRAMs with different nanosheet widths and different spacings.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
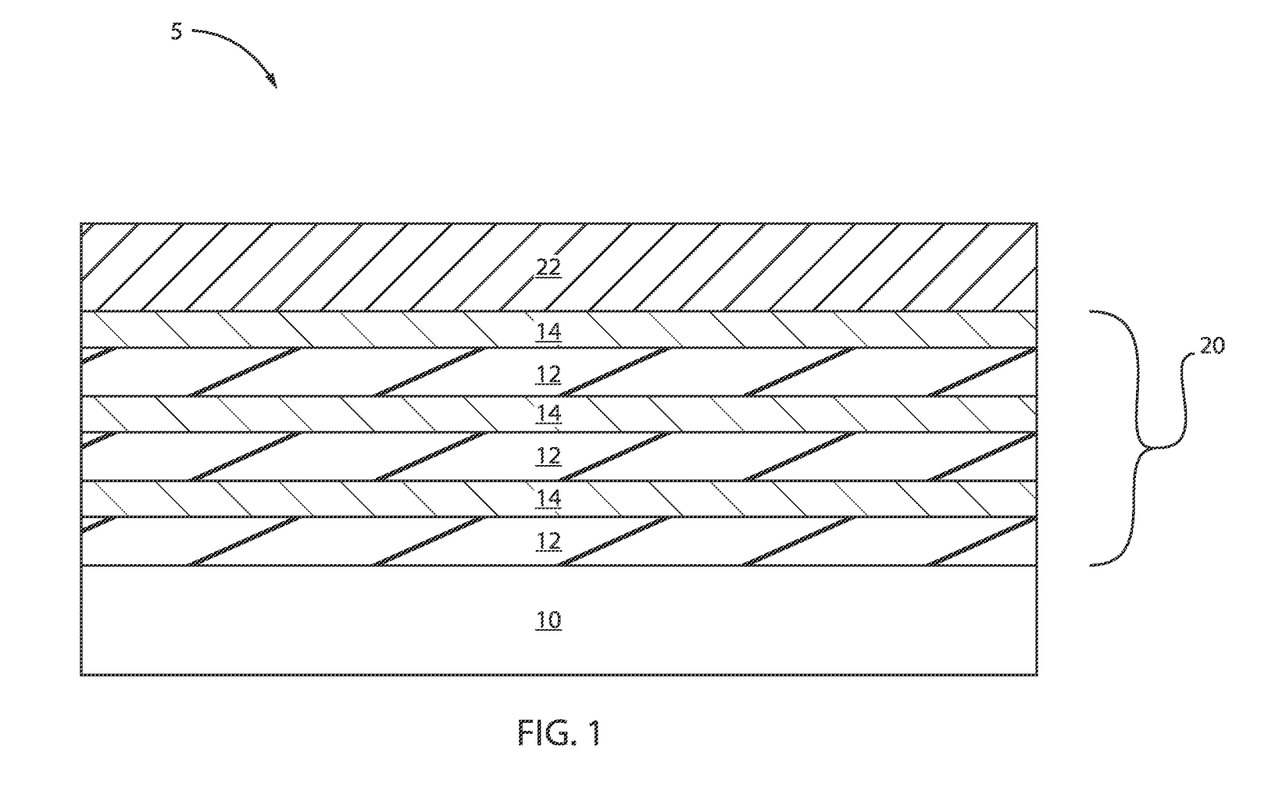
FIG. 1 is a cross-sectional view of a semiconductor structure including a nanosheet stack formed over a substrate, in accordance with an embodiment of the present invention.

FIG. 1 is a cross-sectional view of a semiconductor structure including a nanosheet stack formed over a substrate, in accordance with an embodiment of the present invention.

In various example embodiments, a structure 5 includes a nanosheet stack 20 formed over a substrate 10. A hardmask 22 can be formed over the nanosheet stack 20. The nanosheet stack 20 can include alternating layers of a first material 12 and a second material 14. The first material 12 can be, e.g., silicon germanium (SiGe) and the second material 14 can be, e.g., silicon (Si). In some embodiments, the thickness of the first material ranges from about 4 nm to about 15 nm, and the thickness of the second material ranges from about 8 nm to about 20 nm. Other thickness ranges can also be conceived.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

The hardmask layer 22 can be a nitride, for example, a silicon nitride (SiN), an oxynitride, for example, silicon oxynitride (SiON), or a combination thereof. In a preferred embodiment, the hardmask layer 22 can be silicon nitride (SiN), for example, $Si_3N_4$.

In one or more embodiments, the hardmask layer 22 can have a thickness in the range of about 20 nm to about 100 nm, or in the range of about 35 nm to about 75 nm, or in the range of about 45 nm to about 55 nm, although other thicknesses are contemplated.

Figure 2:
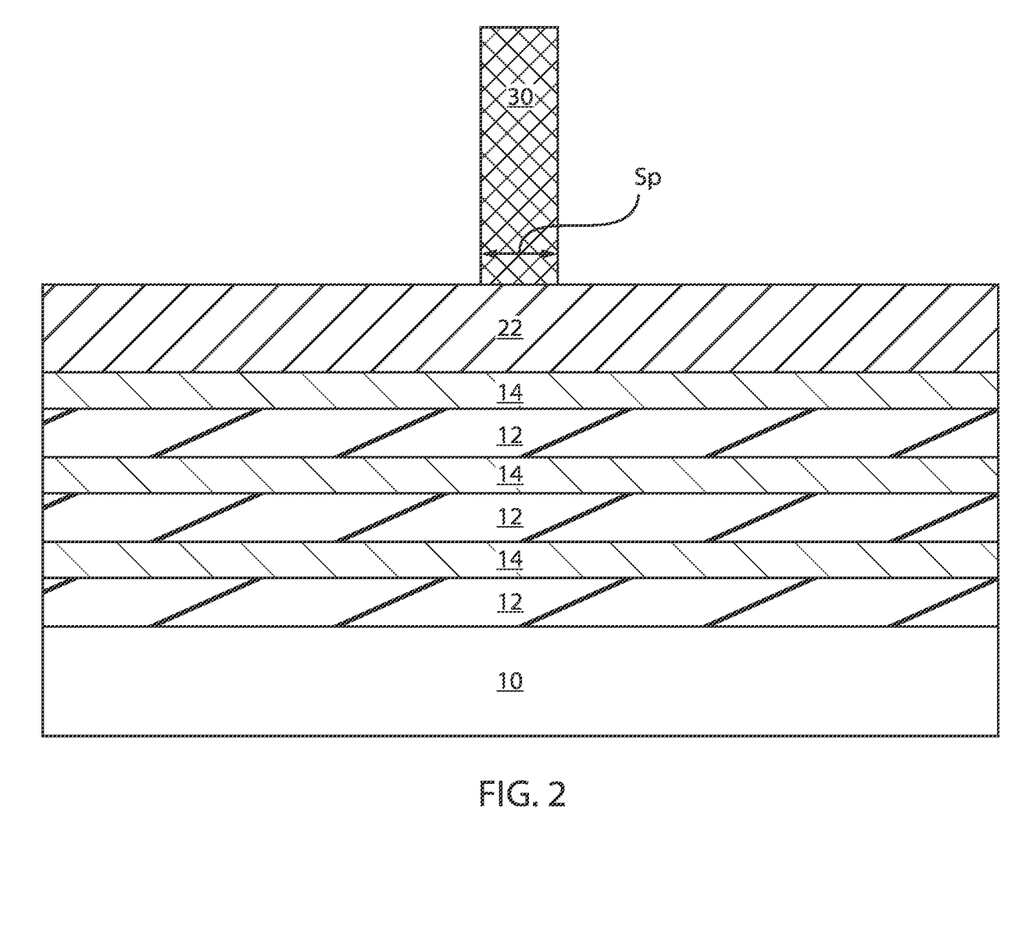
FIG. 2 is a cross-sectional view of the semiconductor structure of FIG. 1 where a mandrel is deposited and patterned, in accordance with an embodiment of the present invention.

FIG. 2 is a cross-sectional view of the semiconductor structure of FIG. 1 where a mandrel is deposited and patterned, in accordance with an embodiment of the present invention.

In various example embodiments, a mandrel 30 is deposited and patterned. The mandrel 30 can be, e.g., an amorphous silicon (a-Si) mandrel. The mandrel 30 can be any suitable materials, including but not limited to, amorphous silicon, polycrystalline silicon, amorphous silicon germanium, polycrystalline silicon germanium, amorphous carbon. The mandrel 30 has a thickness Sp. The mandrel thickness, Sp, determines the spacing between two pFETs in an SRAM cell. Alternatively, the exemplary embodiments can employ the mandrel to define Sn, first spacer to define Wn, second spacer to define Sp, and the third spacer to define Wp. In other words, the methods can flip the order of n and p.

Figure 3:
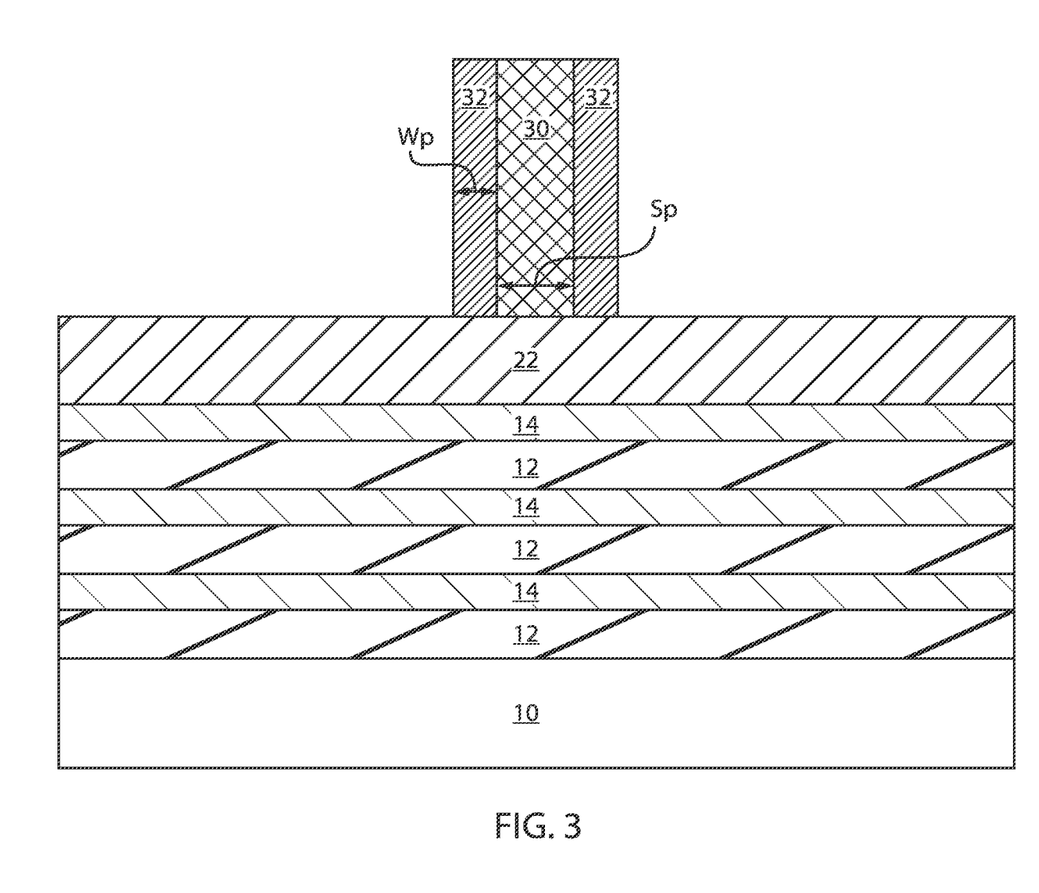
FIG. 3 is a cross-sectional view of the semiconductor structure of FIG. 2 where a first set of spacers are formed, in accordance with an embodiment of the present invention.

FIG. 3 is a cross-sectional view of the semiconductor structure of FIG. 2 where a first set of spacers are formed, in accordance with an embodiment of the present invention.

In various example embodiments, a first set of spacers 32 are formed adjacent the mandrel 30. The first set of spacers 32 can be, e.g., oxide spacers, and can be formed by deposition and reactive ion etching (RIE). The width of the first set of spacers 32 is Wp. The width, Wp, of the first set of spacers 32 determines the width of the pFET nanosheet (NS).

Figure 4:
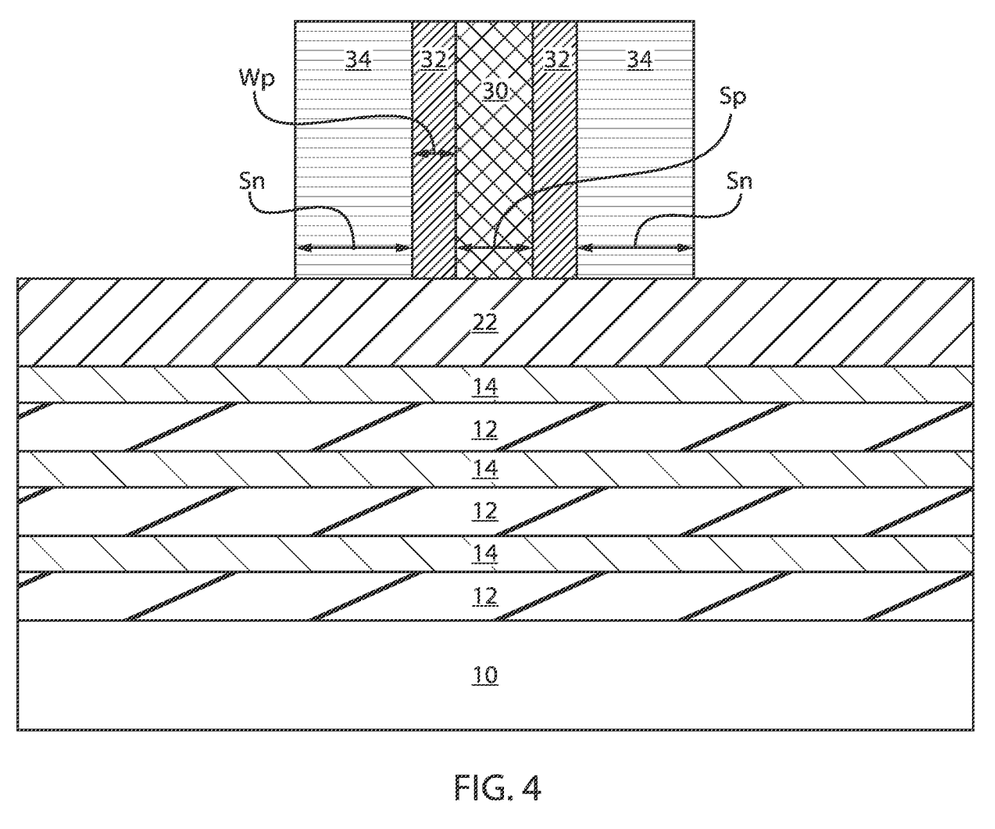
FIG. 4 is a cross-sectional view of the semiconductor structure of FIG. 3 where a second set of spacers are formed adjacent the first set of spacers, in accordance with an embodiment of the present invention.

The first set of spacers 32 can include any of one or more of materials, including but not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, titanium oxide (TiO), titanium nitride (TiN), and combinations thereof. Spacers can be formed by any suitable techniques such as deposition followed by directional etch. Deposition may include but is not limited to, atomic layer deposition (ALD), chemical vapor deposition (CVD). Directional etch may include but is not limited to, reactive ion etch (RIE). FIG. 4 is a cross-sectional view of the semiconductor structure of FIG. 3 where a set of spacers are formed adjacent the first set of spacers, in accordance with an embodiment of the present invention.

In various example embodiments, a second set of spacers 34 are formed adjacent the first set of spacers 32. The second set of spacers 34 can be, e.g., a-Si spacers, and can be formed by deposition and RIE. The mandrel 30 can be any suitable materials, including but not limited to, amorphous silicon, polycrystalline silicon, amorphous silicon germanium, polycrystalline silicon germanium, amorphous carbon. The width of the second set of spacers 34 is Sn. The width, Sn, determines spacing between the nFET NS and the pFET NS. In some embodiments, the second set of spacers 34 and the mandrel 30 can comprise the same material. Alternatively, they can have different materials. The second set of spacers 34 is wider than the mandrel 30. In other words, Sn>Sp. Alternatively, if the methods employ the mandrel 30 to define Sn and the second set of spacers 34 to define Sn, then the second set of spacers 34 is narrower than the mandrel 30.

Figure 5:
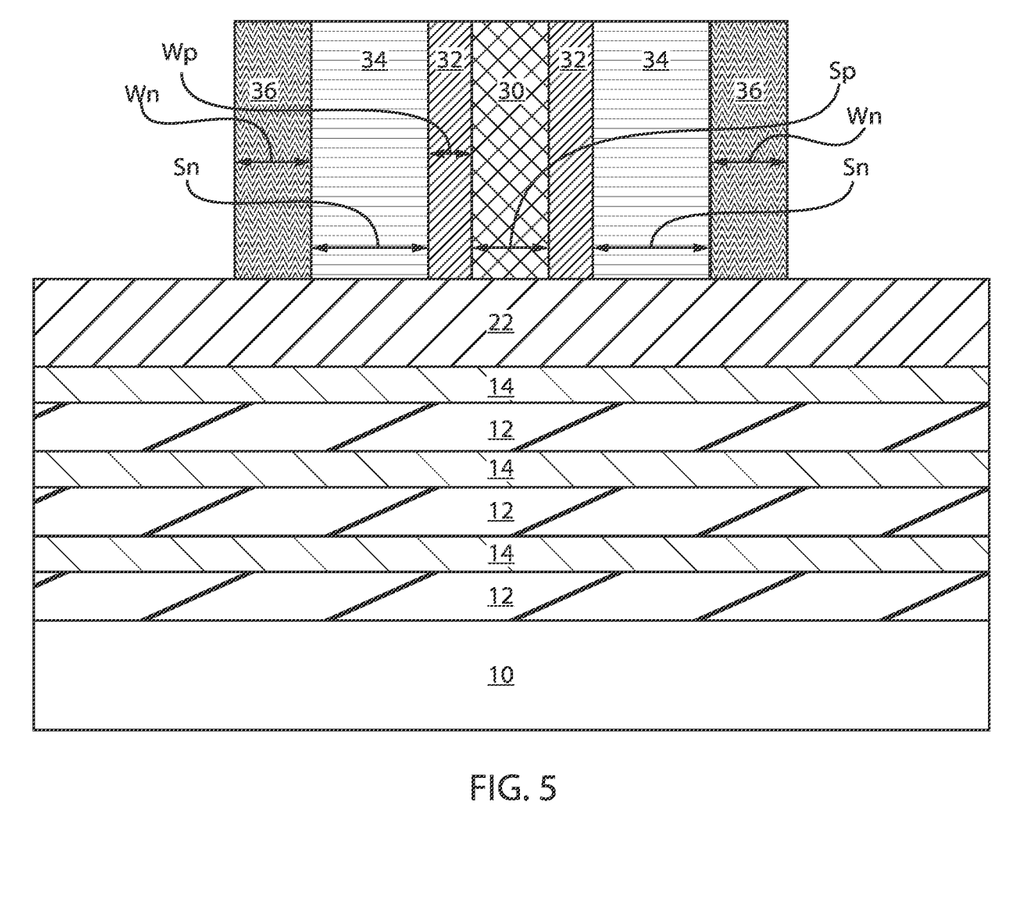
FIG. 5 is a cross-sectional view of the semiconductor structure of FIG. 4 where a third set of spacers are formed adjacent the second set of spacers, in accordance with an embodiment of the present invention.

FIG. 5 is a cross-sectional view of the semiconductor structure of FIG. 4 where a third set of spacers are formed adjacent the second set of spacers, in accordance with an embodiment of the present invention.

In various example embodiments, a third set of spacers 36 are formed adjacent the second set of spacers 34. The third set of spacers 36 can be, for example, materials including but not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, titanium oxide (TiO), titanium nitride (TiN), and combinations thereof. Spacers can be formed by any suitable techniques such as deposition followed by directional etch. Deposition may include but is not limited to, atomic layer deposition (ALD), chemical vapor deposition (CVD). The width of the third set of spacers 36 is Wn. The width, Wn, determines the width of the nFET NS.

The third set of spacers 36 is wider than the first set of spacers 32. In other words, Wn>Wp. Alternatively, if the methods employ the third set of spacers to define Wp and the first set of spacers 32 to define Wn, then the third set of spacers 36 is narrower than the first set of spacers 32.

Figure 6:
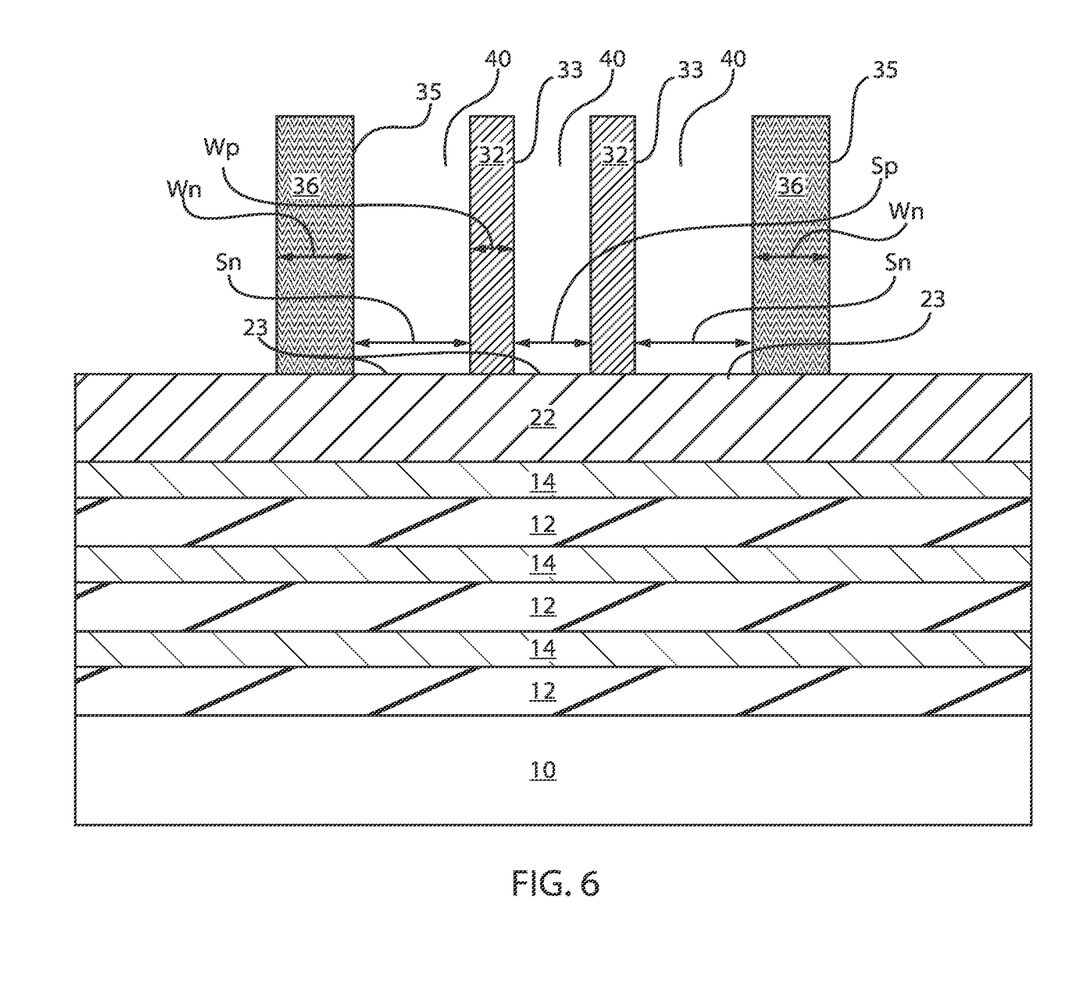
FIG. 6 is a cross-sectional view of the semiconductor structure of FIG. 5 where the a-Si regions are selectively removed, in accordance with an embodiment of the present invention.

FIG. 6 is a cross-sectional view of the semiconductor structure of FIG. 5 where the a-Si regions are selectively removed, in accordance with an embodiment of the present invention.

In various example embodiments, the mandrel 30 and the second set of spacers 34 are selectively removed. Openings 40 are formed between the first set of spacers 32 and between the third set of spacers 36. The sidewalls 33 of the first set of spacers 32 are exposed and the sidewalls 35 of the third set of spacers 36 are exposed. Additionally, a top surface 23 of the hardmask layer 22 is exposed.

The distance between a third spacer 36 and a first spacer 32 is given by Sn. A distance between the first spacers 32 is given by Sp, where Sn>Sp.

Figure 7:
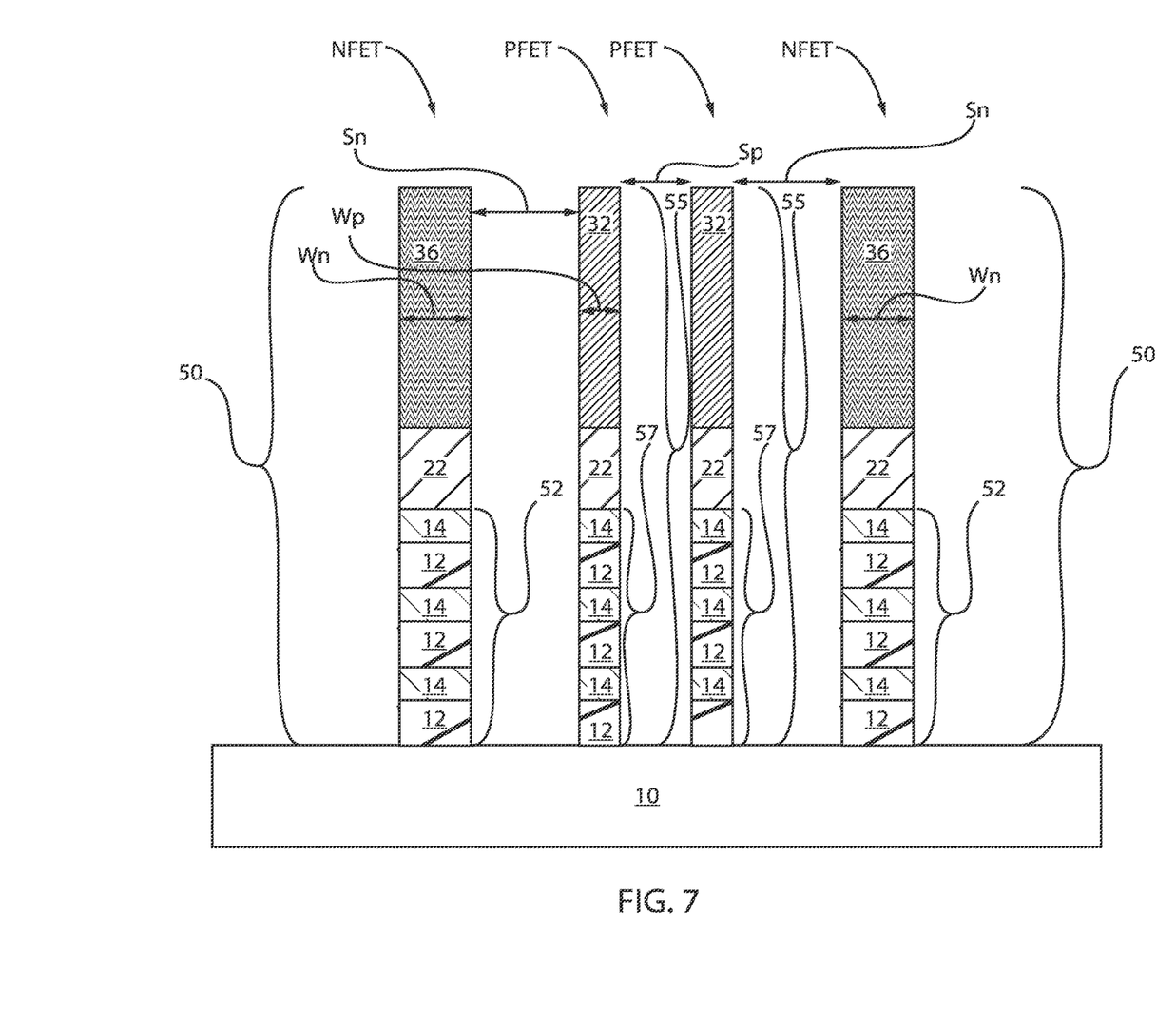
FIG. 7 is a cross-sectional view of the semiconductor structure of FIG. 6 where the nanosheet stack is etched to form wide nanosheet for nFET and narrow nanosheet for pFET, in accordance with an embodiment of the present invention.

FIG. 7 is a cross-sectional view of the semiconductor structure of FIG. 6 where the nanosheet stack is etched to form wide nanosheet for nFET and narrow nanosheet for pFET, in accordance with an embodiment of the present invention.

In various example embodiments, the nanosheet stack 20 is etched to form wide nanosheet 52 for nFET and narrow nanosheet 57 for pFET. The structures 50 for the nFET are wider than the structures 55 for the pFET. The distance between the nFET structure 50 and the adjacent pFET structure 55 is given by Sn. The distance between adjacent pFET structures 55 is given by Sp.

Therefore, the exemplary embodiments of the present invention provide for a method and structure for forming NS SRAM by SIT process with the flexibility to independently tune the widths of nFET NS and pFET NS. The exemplary embodiments also provide the flexibility to obtain N-P spacing without the constraint of 'quantization' effect of the conventional SIT process. Stated differently, the exemplary embodiments provide a nanosheet SRAM with wider nFET and narrow pFET where both Wn and Wp are precisely controlled by SIT spacer thicknesses. The spacing between the nFET and pFET is greater than the spacing between the pFET and pFET. In some embodiments, Sn is precisely controlled by the SIT spacer thickness and Sp is controlled by the thickness of original mandrel. In some embodiments, Sp is precisely controlled by SIT spacer thickness and Sn is controlled by the thickness of original mandrel. Moreover, the nanosheet SRAMs have different nanosheet widths and different nanosheet spacings, while the nanosheet SRAMs are formed by a single spacer material. As a result, multiple nanosheet stacks can be simultaneously or concurrently formed for SRAMs. In addition, all transistors have the same number of nanosheets. The different device widths are achieved by using different widths of spacers.

It is noted that the nFET nanostacks are adjacent the pFET nanostacks. The nFET nanostacks and the pFET nanostacks are formed on the common substrate 10.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

Figure 8:
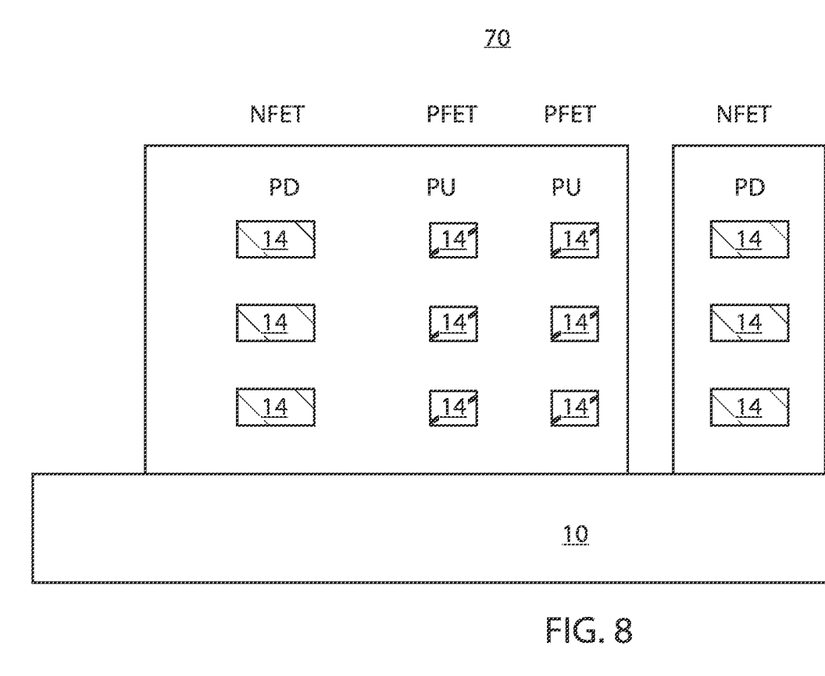
FIG. 8 is a top view of the semiconductor structure of FIG. 7 and a cross-sectional view along axis A-A, in accordance with an embodiment of the present invention.

FIG. 8 is a top view of the semiconductor structure of FIG. 7 and a cross-sectional view along axis A-A, in accordance with an embodiment of the present invention.

It is noted that the manufacturing process does not end at FIG. 7. Instead, nanosheet CMOS fabrication is continued by, e.g., cutting the pFET NS into segments, forming isolation, gate, source, and drain regions, etching the SiGe in NS stack to form a Si NS channel, forming contacts, etc. These processes are not shown for sake of clarity.

As shown in FIG. 8, the nFET NS is wider than pFET NS, e.g., Wn>Wp. Also, N-P spacing is greater than P-P spacing, e.g., Sn>Sp.

Referring back to FIG. 8, the top view 60 illustrates the nFET nanosheet stacks 52 and the pFET nanosheet stacks 57. The nFET nanosheet stacks 52 have a greater width than the pFET nanosheet stacks 57. In other words, Wn>Wp. Additionally, the distance between an nFET nanosheet stack 52 and an adjacent pFET nanosheet stack 57 is Sn, which is greater than the distance between adjacent pFET nanosheet stack 57, Sp. In other words, Sn>Sp.

A cut along the line A-A shows the structure 70 illustrating the remaining Si layers 14 of the nanosheet stack 20 and the removal of the SiGe layers 12 of the nanosheet stack 20. The SiGe layers 12 are etched to form Si NS channels. The designation "PU" refers to pFET pull-up, the designation "PD" refers to nFET pull-down, and the designation "PG" refers to nFET pass gate.

In summary, NS SRAM with wider nFET and narrow pFET, e.g., Wn>Wp is achieved. Both Wn and Wp are precisely controlled by SIT spacer thicknesses. N-P spacing is also greater than P-P spacing, e.g., Sn>Sp to meet ground rule requirements. Sn is precisely controlled by SIT spacer thickness and Sp is controlled by the thickness of original mandrel.

Regarding FIGS. 1-7, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for constructing high-density static random access memory (SRAM) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing high-density static random access memory (SRAM), the method comprising:
   forming a nanosheet SRAM by a sidewall image transfer (SIT) process; and
   independently tuning widths of n-type field effect transistor (nFET) nanosheet structures and p-type field effect transistor (pFET) nanosheet structures of the nanosheet SRAM by using multiple sets of spacers, wherein at least one of the sets of spacers controls spacing between the nFET nanosheet structures and the pFET nanosheet structures,
   wherein the multiple sets of spacers include a first set of spacers, a second set of spacers, and a third set of spacers sequentially formed; and
   wherein the first set of spacers control a width of the pFET nanosheet structures and the third set of spacers control a width of the nFET nanosheet structures.

2. The method of claim 1, wherein the nFET nanosheet structures have a first width and the pFET nanosheet structures have a second width, the first width being greater than the second width.

3. The method of claim 1, wherein a distance between an nFET nanosheet structure and an adjacent pFET nanosheet structure is greater than a distance between two adjacent pFET nanosheet structures.

4. The method of claim 1, wherein the nFET nanosheet structures and the pFET nanosheet structures are formed concurrently.

5. The method of claim 1, wherein the nanosheet SRAM is formed directly between a substrate and a hardmask layer.

6. The method of claim 1, wherein the second set of spacers control the spacing between the nFET nanosheet structures and the pFET nanosheet structures.

7. A method for constructing high-density static random access memory (SRAM), the method comprising:
   constructing a nanosheet stack over a substrate;
   forming a mandrel over the nanosheet stack;
   forming a first set of spacers adjacent the mandrel;
   forming a second set of spacers adjacent the first set of spacers;
   forming a third set of spacers adjacent the second set of spacers, wherein the first, second, and third set of spacers are formed sequentially;
   selectively removing the mandrel and the second set of spacers; and
   etching the nanosheet stack to form nanosheet structures having different widths and different spacing therebetween,
   wherein at least one of the first, second, or third set of spacers controls spacing between the nanosheet structures,
   wherein the first set of spacers control a width of a first set of nanosheet structures and the third set of spacers control a width of a second set of nanosheet structures, and
   wherein the second set of nanosheet structures are nFET nanosheet structures and the first set of nanosheet structures are pFET nanosheet structures.

8. The method of claim 7, wherein the nFET nanosheet structures and the pFET nanosheet structures are formed concurrently.

9. The method of claim 8, wherein the nFET nanosheet structures have a width that is greater than the width of the pFET nanosheet structures.

10. The method of claim 9, wherein the nFET nanosheet structures have a same number of nanosheets as the pFET nanosheet structures.

11. The method of claim 10, wherein spacing between an nFET nanosheet structure and an adjacent pFET nanosheet structure is greater than a spacing between two adjacent pFET nanosheets structures.

12. The method of claim 7, wherein the second set of spacers control the spacing between the first set of nanosheet structures and the second set of nanosheet structures.

13. A semiconductor structure for constructing high-density static random access memory (SRAM), the semiconductor structure comprising:
    nFET nanosheet structures having a first width disposed over a substrate;
    pFET nanosheet structures having a second width disposed over the substrate, the first width being greater than the second width; and
    a plurality of spacers controlling spacing between the nFET nanosheet structures and the pFET nanosheet structures,
    wherein the plurality of spacers include a first set of spacers, a second set of spacers, and a third set of spacers sequentially formed; and
    wherein the first set of spacers control a width of the pFET nanosheet structures and the third set of spacers control a width of the nFET nanosheet structures.

14. The semiconductor structure of claim 13, wherein spacing between an nFET nanosheet structure and an adjacent pFET nanosheet structure is greater than a spacing between two adjacent pFET nanosheets structures.

15. The semiconductor structure of claim 13, wherein the nFET nanosheet structures have a same number of nanosheets as the pFET nanosheet structures.

16. The semiconductor structure of claim 13, wherein the nFET nanosheet structures and the pFET nanosheet structures are constructed concurrently.

17. The semiconductor structure of claim 13, wherein the first and second widths are independently tuned.

* * * * *